(12) United States Patent
Shin et al.

(10) Patent No.: US 9,972,663 B2
(45) Date of Patent: *May 15, 2018

(54) ORGANIC LIGHT EMITTING DISPLAY DEVICE INCLUDING DRIVING SUB-PIXELS EACH OVERLAPPING WITH MULTIPLE COLOR SUB-PIXELS

(71) Applicant: LG DISPLAY CO., LTD., Seoul (KR)

(72) Inventors: Aram Shin, Seoul (KR); Juhn-Suk Yoo, Goyang-si (KR); Soo-Jeong Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 32 days.

This patent is subject to a terminal disclaimer.

(21) Appl. No.: 15/018,577

(22) Filed: Feb. 8, 2016

(65) Prior Publication Data

US 2016/0155780 A1   Jun. 2, 2016

Related U.S. Application Data

(63) Continuation of application No. 13/467,737, filed on May 9, 2012.

(30) Foreign Application Priority Data

Feb. 24, 2012   (KR) .................. 10-2012-0019225

(51) Int. Cl.
*G09G 3/30* (2006.01)
*H01L 27/32* (2006.01)

(52) U.S. Cl.
CPC ........ *H01L 27/3216* (2013.01); *H01L 27/326* (2013.01); *H01L 27/3218* (2013.01);
(Continued)

(58) Field of Classification Search
None
See application file for complete search history.

(56) References Cited

U.S. PATENT DOCUMENTS 6,940,222 B2   9/2005   Sakurai
8,330,352 B2   12/2012  Sung et al.
(Continued)

FOREIGN PATENT DOCUMENTS

KR   10-2006-0093154 A   8/2006
KR   10-2011-0074844 A   7/2011

*Primary Examiner* — Patrick Edouard
*Assistant Examiner* — Matthew Yeung
(74) *Attorney, Agent, or Firm* — Birch, Stewart, Kolasch & Birch, LLP (57) ABSTRACT

An organic light emitting display device can include a plurality of color sub-pixels including first, second and third color sub-pixels, the first and second color sub-pixels disposed along a first direction, and the third color sub-pixel disposed adjacent to the first and second color sub-pixels along a second direction different from the first direction; and a plurality of driving sub-pixels configured to drive light emitting diodes of the color sub-pixels. Also, each of the driving sub-pixels can include a driving transistor and a switching unit, and each and every one of the driving sub-pixels overlapping with at least two color sub-pixels among the plurality of color sub-pixels. In addition, the first, second and third color sub-pixels correspond to a portion of four of the driving sub-pixels, and one of the driving sub-pixels overlaps with three or four corresponding color sub-pixels among the plurality of color sub-pixels.

13 Claims, 7 Drawing Sheets

(52) U.S. Cl.
CPC ...... *H01L 27/3248* (2013.01); *H01L 27/3276* (2013.01); *H01L 2251/5315* (2013.01)

(56) References Cited

U.S. PATENT DOCUMENTS

| | | | |
|---|---|---|---|
| 2002/0070909 A1* | 6/2002 | Asano | G09G 3/3233 |
| | | | 345/76 |
| 2003/0052597 A1 | 3/2003 | Sakurai | |
| 2005/0139834 A1 | 6/2005 | Park et al. | |
| 2007/0001954 A1 | 1/2007 | Shishido et al. | |
| 2007/0002084 A1 | 1/2007 | Kimura et al. | |
| 2008/0111459 A1* | 5/2008 | Helber | G02B 5/223 |
| | | | 313/506 |
| 2009/0322215 A1* | 12/2009 | Sung | H01L 27/3211 |
| | | | 313/504 |
| 2011/0248985 A1* | 10/2011 | Lin | G09G 3/3614 |
| | | | 345/214 |
| 2011/0279014 A1 | 11/2011 | Winters et al. | |
| 2012/0056531 A1* | 3/2012 | Park | H01L 51/5036 |
| | | | 313/506 |
| 2012/0097933 A1 | 4/2012 | Ando | |

\* cited by examiner

FIG. 1

Related Art

ORGANIC LIGHT EMITTING DISPLAY DEVICE INCLUDING DRIVING SUB-PIXELS EACH OVERLAPPING WITH MULTIPLE COLOR SUB-PIXELS

CROSS-REFERENCE TO RELATED APPLICATIONS

This application is a Continuation of co-pending U.S. patent application Ser. No. 13/467,737 filed on May 9, 2012, which claims the benefit under 35 U.S.C. § 119(a) to Korean Patent Application No. 10-2012-0019225 filed on Feb. 24, 2012, all of which are hereby expressly incorporated by reference into the present application.

BACKGROUND OF THE INVENTION

Field of the Invention

The present disclosure relates to an organic light emitting display device, and more particularly, to a top emission type organic light emitting display device.

Discussion of the Related Art

An organic light emitting display (OLED) device is an emissive type display device where an electron of a first electrode and a hole of a second electrode are injected into an emission portion and a light is emitted when an exciton generated by the combination of the electron and the hole transitions from an excited state to a ground state.

Since the OLED device has excellent properties such as a wide viewing angle, a fast response speed and a high contrast ratio, the OLED device may be used as a graphic display, a display for television and a surface light source. In addition, the OLED device is suitable for a next generation flat panel display because of its thin profile, light weight and excellent color gamut. Further, the OLED device has an advantage such that the OLED device may be formed by using a flexible transparent substrate such as a plastic substrate.

The OLED device may be classified into a top emission type and a bottom emission type according to an emission direction of a light. The bottom emission type OLED device has a high stability and a high degree of freedom in process. However, since the bottom emission type OLED device has a limitation in aperture ratio, it is difficult to apply the bottom emission type OLED device for a high resolution product. Recently, as a result, the top emission type OLED device has been widely used.

Figure 1:
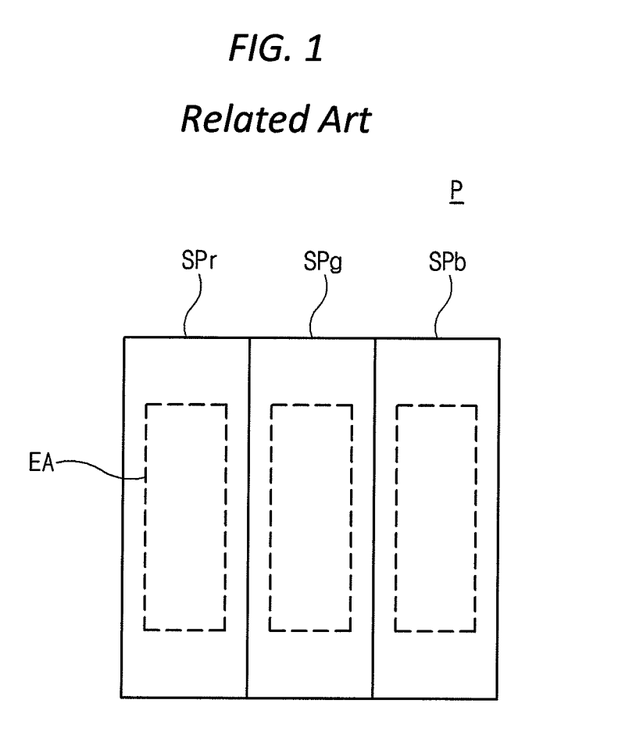
FIG. 1 is plan view showing a stripe type pixel of an organic light emitting display device according to the related art.

FIG. 1 is plan view showing a stripe type pixel of an organic light emitting display device according to the related art. In FIG. 1, a stripe type pixel P includes red, green and blue sub-pixels SPr, SPg and SPb which are all arranged along a horizontal direction. Each of the red, green and blue sub-pixels SPr, SPg and SPb includes an emission area EA, and the emission areas EA of the red, green and blue sub-pixels SPr, SPg and SPb emit lights having colors different from one another.

In the organic light emitting display (OLED) device having the stripe type pixel, generally, an organic material is deposited on a substrate using a shadow mask having a plurality of open patterns. As a result, an organic emitting layer having a plurality of organic thin film patterns separated from one another is formed on the substrate, and the plurality of organic thin film patterns of the organic emitting layer emit a red-colored light, a green-colored light and a blue-colored light.

Even when the OLED device is a top emission type, the plurality of organic thin film patterns emitting lights having different colors are spaced apart from one another by a gap to prevent a shadowing effect caused by an ambiguous border between adjacent organic thin film patterns. A gap area defined by the distance of the gap is a non-emissive region and may be referred to as a dead zone. The dead zone makes it difficult to obtain a high color reproducibility and a high resolution in the OLED device.

An OLED device may be classified into a passive matrix type organic light emitting display (PMOLED) device and an active matrix type organic light emitting display (AMOLED) device according to a method of driving an organic light emitting diode. The AMOLED device includes a plurality of scan lines, a plurality of data lines, a plurality of power lines and a plurality of pixels. The plurality of pixels are connected to the plurality of scan lines, the plurality of data lines and the plurality of power lines and are arranged in matrix. Generally, each of the plurality of pixels includes a light emitting diode (LED), a driving thin film transistor (TFT) adjusting an amount of current supplied to the LED, a switching TFT transmitting a data signal to the driving TFT and a storage capacitor keeping a voltage of the data signal.

Although the AMOLED device has an advantage in power consumption, the AMOLED device has non-uniformity in display because intensity of the current flowing through the driving TFT changes due to a deviation in threshold voltage defined by the voltage difference between a gate electrode and a source electrode of the driving TFT. Since the property of the TFT in the pixels changes according to process parameters, the driving TFTs in the pixels have a deviation in threshold voltage. To overcome the non-uniformity in the display between the pixels, a compensating circuit that compensates the threshold voltage of the driving TFT is further formed in the pixel. The compensating circuit includes a plurality of driving elements. However, since the compensating circuit including the plurality of driving elements is formed in a limited region of each sub-pixel, degree of freedom in design and integration of the driving elements for the LED is further restricted.

SUMMARY OF THE INVENTION

Accordingly, the present invention is directed to an organic light emitting display device that substantially obviates one or more of the problems due to limitations and disadvantages of the related art.

An object of the present disclosure is to provide a top emission type organic light emitting display device where a plurality of organic thin film patterns are spaced apart from one another by a predetermined gap distance in a pixel.

Another object of the present disclosure is to provide an organic light emitting display device having a high color reproducibility and a high resolution due to improvement of degree of freedom in design and integration of the driving elements for driving a light emitting diode in a sub-pixel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting display device according to an embodiment includes: a substrate having a plurality of sub-pixels including first, second and third sub-pixels, the first and second sub-pixels disposed along a vertical direction and the third sub-pixel disposed adjacent to the first and second sub-pixels along a horizontal direction; a plurality of driving elements in a driving region overlapping at least two of the plurality of sub-pixels; a first electrode over the plurality of driving elements in each of the plurality of sub-pixels; an organic emitting layer on the first electrode in each of the plurality of sub-pixels; and a second electrode on the organic emitting layer and over an entire surface of the substrate.

In another aspect, an organic light emitting display device includes: a substrate having first to sixth sub-pixels and first to sixth driving sub-pixels, wherein the first, second, fourth and fifth sub-pixels are sequentially disposed along a vertical direction, the third sub-pixel is disposed adjacent to the first and second sub-pixels along a horizontal direction, and the sixth sub-pixel is disposed adjacent to the fourth and fifth sub-pixels along the horizontal direction, and wherein the first to sixth driving sub-pixels are disposed in 3×2 matrix; a plurality of driving elements in each of the first to sixth driving sub-pixels over the substrate; and a light emitting diode in each of the first to sixth sub-pixels over the plurality of driving elements electrode, the light emitting diode connected to the plurality of driving elements, wherein the first, second, fourth and fifth sub-pixels have a same size and a same shape as one another, the third and sixth sub-pixels have a same size and a same shape as each other, and each of the first, second, fourth and fifth sub-pixels has a different size and a different shape from each of the third and sixth sub-pixels, and wherein the first to sixth driving sub-pixels have a same size and a same shape as one another.

According to an embodiment, the invention provides an organic light emitting display device, including: a substrate having a plurality of sub-pixels including first, second and third sub-pixels, the first and second sub-pixels disposed along a first direction and the third sub-pixel disposed adjacent to the first and second sub-pixels along a second direction; and a plurality of driving sub-pixels formed on the substrate, each of the driving sub-pixels including at least a driving transistor and a switching unit, wherein each of the driving sub-pixels corresponds to at least two sub-pixels among the plurality of sub-pixels.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the preferred embodiments, examples of which are illustrated in the accompanying drawings.

Figure 2:
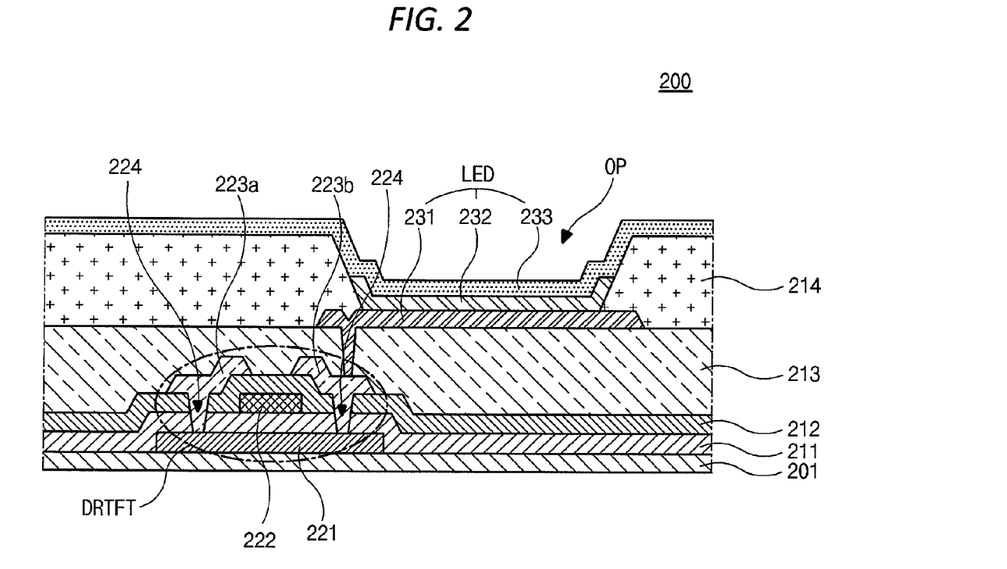
FIG. 2 is a cross-sectional view showing a top emission type organic light emitting display device according to an embodiment of the present invention.

FIG. 2 is a cross-sectional view showing a top emission type organic light emitting display (OLED) device according to an embodiment of the present invention. Since sub-pixels constituting a pixel have the same structure as one another, FIG. 2 shows a single sub-pixel. The OLED device of FIG. 2 thus includes a plurality of pixels, each pixel having a plurality of sub-pixels, where all the sub-pixels have the same structure (e.g., the structure shown in FIG. 2) although the size, shape and orientation may be different. The top emission OLED device of FIG. 2 and other figures discussed below further includes other components to operate the OLED device, such as data lines, gate lines, drivers, timing controller, etc. All the components of the OLED display of FIG. 2 are operatively coupled and configured.

In FIG. 2, a top emission type organic light emitting display device 200 includes a substrate 201, a semiconductor layer 221, a first insulating layer 211, a gate electrode 222, a second insulating layer 212, a source electrode 223a, a drain electrode 223b and a passivation layer 213. The semiconductor layer 221 is formed on the substrate 221. The semiconductor layer 221 may include one of amorphous silicon and polycrystalline silicon having an impurity-doped region of source and drain regions. When the semiconductor layer 221 is formed of polycrystalline silicon, an amorphous silicon layer may be crystallized to become a polycrystalline silicon layer after an amorphous silicon layer is formed on the substrate 201. The amorphous silicon layer may be crystallized through one of a rapid thermal annealing (RTA) method, a solid phase crystallization (SPC) method, an excimer laser annealing (ELA) method, a metal induced crystallization (MIC) method, a metal induced lateral crystallization (MILC) method and a sequential lateral solidification (SLS) method.

The first insulating layer 211 for insulating the semiconductor layer 221 and the gate electrode 222 is formed on the semiconductor layer 221, and the gate electrode 222 is formed on the first insulating layer 211. In addition, the first insulating layer 211 may include one of an inorganic insulating material such as silicon oxide (SiOx) or silicon nitride (SiNx) and an organic insulating material such as benzocyclobutene (BCB) or acrylic resin.

The gate electrode 222 may include a conductive material such as magnesium (Mg), aluminum (Al), nickel (Ni), chromium (Cr), molybdenum (Mo), tungsten (W), molybdenum tungsten (MoW), gold (Au), etc. In addition, the gate electrode 222 may include one of a single layer and a multiple layer.

The second insulating layer 212 is formed on the gate electrode 222 and the first insulating layer 211. The second insulating layer 212 may include an organic insulating material such as benzocyclobutene (BCB) and acrylic resin. The first and second insulating layers 211 and 212 have contact holes 224 exposing the source and drain regions of the semiconductor layer 221.

The source and drain electrodes 223a and 223b are formed on the second insulating layer 212. The source and drain electrodes 223a and 223b are connected to the source and drain regions, respectively, of the semiconductor layer 221 through the contact holes 224. The source and drain electrodes 223a and 223b may include a conductive material such as magnesium (Mg), aluminum (Al), nickel (Ni), chromium (Cr), molybdenum (Mo), tungsten (W), molybdenum tungsten (MoW), gold (Au), etc. In addition, each of the source and drain electrodes 223a and 223b may include one of a single layer and a multiple layer.

The passivation layer 213 for planarizing and protecting a driving thin film transistor (TFT) DRTFT is formed on the source and drain electrodes 223a and 223b. The passivation layer 213 may include one of an inorganic insulating material such as silicon oxide (SiOx) or silicon nitride (SiNx) and an organic insulating material such as benzocyclobutene (BCB) or acrylic resin. In addition, the passivation layer 213 may include one of a single layer and a multiple layer.

The semiconductor layer 221, the first insulating layer 211, the gate electrode 222, the second insulating layer 212, the source electrode 223a and the drain electrode 223b may constitute the driving TFT DRTFT. Although the driving TFT DRTFT is used for an OLED device having a light emitting diode (LED) in the present disclosure, the driving TFT DRTFT may be used for various display devices.

The OLED device 200 further includes a light emitting diode LED formed on the passivation layer 213 and connected to the driving TFT DRTFT. The light emitting diode LED includes a first electrode 231, a second electrode 233 and an organic emitting layer 232 between the first and second electrodes 231 and 233. The first electrode 231 of the light emitting diode LED is electrically connected to the drain electrode 223b of the driving TFT DRTFT.

The first electrode 231 is independently formed on the passivation layer 213 in each sub-pixel and contacts the corresponding drain electrode 223b. In addition, the first electrode 231 may include an opaque conductive material having a work function smaller than the second electrode 233 so that the first electrode 231 can function as a cathode. For example, the first electrode 231 may include one of aluminum (Al), silver (Ag), magnesium (Ng), gold (Au) and aluminum alloy such as aluminum neodymium (AlNd) or aluminum magnesium (AlMg).

The second electrode 233 is formed on the organic emitting layer 232 and over an entire surface of the substrate 201 including the plurality of pixels. In addition, the second electrode 233 may include a transparent conductive material having a work function greater than the first electrode 231 so that the second electrode 233 can function as an anode. For example, the second electrode 233 may include one of indium-tin oxide (ITO) and indium-zinc-oxide (IZO).

The organic emitting layer 232 is formed to correspond to the sub-pixel. The organic emitting layer 232 may include a single layer of an emitting material or a multiple layer of an electron injecting layer, an electron transporting layer, an emitting material layer, a hole transporting layer and a hole injection layer for improving an emission efficiency.

Further, a bank layer 214 is formed between the first and second electrodes 231 and 233. The bank layer 214 has an open portion OP exposing the first electrode 231 and the organic emitting layer 232 is formed in the open portion OP. In addition, the bank layer 214 may include an inorganic insulating material such as silicon oxide (SiOx) or silicon nitride (SiNx), or an organic insulating material such as benzocyclobutene (BCB) or acrylic resin.

In the top emission type OLED device 200, when voltages are applied to the first and second electrodes 231 and 233 according to a data signal of the corresponding sub-pixel, a hole and an electron are transmitted to the organic emitting layer 232 to constitute an exciton. When the exciton transitions from an excited state to a ground state, a light is generated and emitted as a visible ray. The light passes through the transparent second electrode 233 to display an image.

After the driving TFT DRTFT and the light emitting diode LED are formed over the substrate 201, an encapsulation process is performed to protect the light emitting diode LED from an exterior contamination source such as moisture and oxygen. For example, a thin film encapsulation method may be used for the encapsulation process.

Although the light emitting diode LED is formed on the substrate 201 having driving elements in the OLED device 200, a first substrate having driving elements and a second substrate having a light emitting diode may be attached after the driving elements are formed on the first substrate and after the light emitting diode is formed on the second substrate in another embodiment.

In addition, a plurality of driving elements for a compensating circuit that compensates a threshold voltage of the driving TFT DRTFT as well as a switching TFT may be provided for each sub-pixel. The plurality of driving elements may be freely disposed in a pixel.

Figure 3:
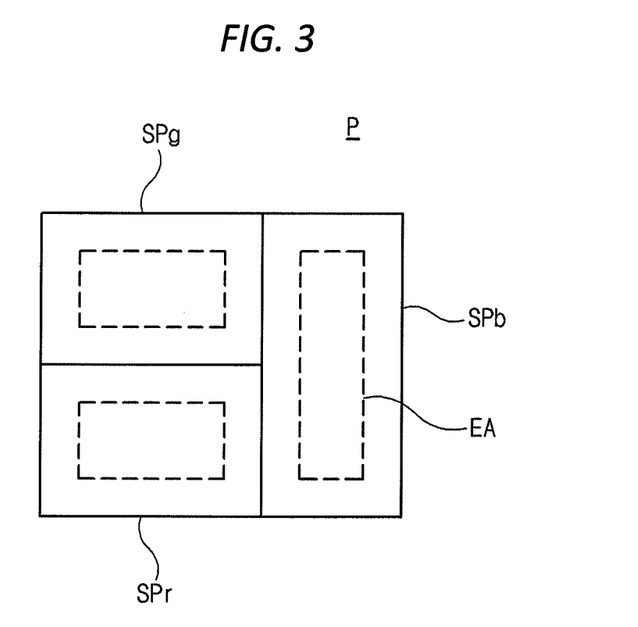
FIG. 3 is a plan view showing a pixel of a top emission type organic light emitting display device according to an embodiment of the present invention.

FIG. 3 is a plan view showing a pixel of a top emission type organic light emitting display device according to an embodiment of the present invention. The top emission type organic light emitting display device of FIG. 3 includes a plurality of such pixels as well as other components. Each of the sub-pixels in each pixel of FIG. 3 can have the structure of the sub-pixel shown in FIG. 2. or other structure of a sub-pixel although the size, shape and orientation may be different.

In FIG. 3, a pixel P includes a plurality of sub-pixels arranged in matrix. Each of the plurality of sub-pixels may be defined by the light emitting diode LED (of FIG. 2) having the organic emitting layer 232 (of FIG. 2). For example, the plurality of sub-pixels may include red, green and blue sub-pixels SPr, SPg and SPb constituting the single pixel P. Red, green and blue light emitting diodes having red, green and blue organic thin film patterns are formed in the red, green and blue sub-pixels SPr, SPg and SPb, respectively. The red, green and blue light emitting diodes emit red, green and blue colored lights, respectively. As a variation, however, a different number of LEDs having different colors may be used per sub-pixel.

Each of the red, green and blue sub-pixels SPr, SPg and SPb includes an emission area EA where the organic thin film pattern of the organic emitting layer 232 is formed. For example, the emission area EA may correspond or substantially correspond to the open portion OP of the bank layer 214 (of FIG. 2). While the red and green sub-pixels SPr and SPg may have the same size and the same shape and orientation as each other, the blue sub-pixel SPb has a different size and a different shape and orientation from each of the red and green sub-pixels SPr and SPg. That is, the red and green sub-pixels SPr and SPg are oriented along a horizontal direction (or one direction) while the blue sub-pixel SPb of a different size and shape is orientated along a vertical direction (or a direction substantially different from or perpendicular to the orientation direction of the red and green sub-pixels). For example, each of the red and green sub-pixels SPr and SPg may have their first side greater than their second side, and the blue sub-pixel SPb may have its first side smaller than its second side.

The green and red sub-pixels SPg and SPr are alternately repeated along the vertical direction and the blue sub-pixel SPb is disposed adjacent to the green and red sub-pixels SPg and SPr along the horizontal direction perpendicular to the vertical direction. For example, when the green and red sub-pixel SPg and SPr are assumed as a green-blue sub-pixel, the green-blue sub-pixel and the blue sub-pixel SPb are alternately repeated along the horizontal direction and a set of the green-blue sub-pixel and the blue sub-pixel SPb is repeated along the vertical direction. As a result, the pixel P of the OLED device may be a stripe type.

Although the green, red, green and red sub-pixels SPg, SPr, SPg and SPr are illustrated to be sequentially disposed along the vertical direction in this example, a set of red, green, red and green sub-pixels, a set of red, green, green and red sub-pixels, or a set of green, red, red and green sub-pixels may be sequentially or repeatedly disposed along the vertical direction in another example.

Figure 4:
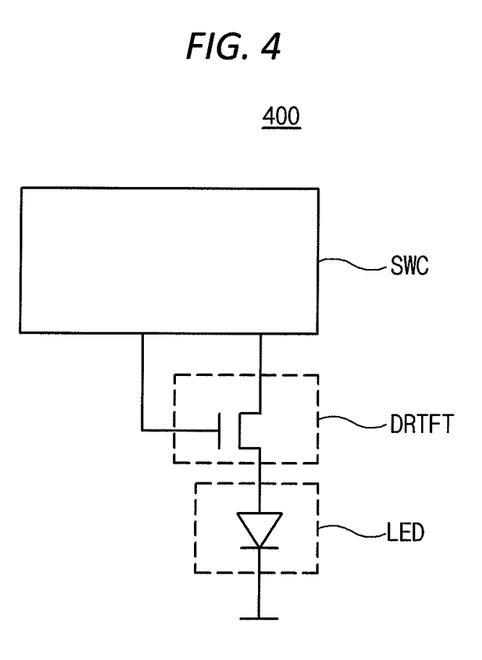
FIG. 4 is an equivalent circuit diagram showing a sub-pixel circuit unit of a top emission type organic light emitting display device according to an embodiment of the present invention.

FIG. 4 is a diagram showing a sub-pixel circuit 400 of a top emission type organic light emitting display device according to an embodiment of the present invention.

In FIG. 4, a sub-pixel circuit unit 400 for driving a sub-pixel includes a switching circuit SWC and a driving thin film transistor (TFT) DRTFT for driving a light emitting diode LED. The DRTFT and the LED here can correspond to the DRTFT and the LED shown in FIG. 2. The switching circuit SWC includes a plurality of driving elements for driving the light emitting diode LED electrically connected thereto. For example, the plurality of driving elements may include a plurality of switching TFTs and a plurality of storage capacitors. The plurality of driving elements may further include a plurality of compensating TFTs for a compensating circuit that compensates a threshold voltage of the driving TFT DRTFT.

Operation of the sub-pixel circuit unit 400 will be discussed hereinafter. The switching TFT is turned on according to a gate signal applied to a gate electrode of the switching TFT through a gate line so that a current can flow between source and drain electrodes of the switching TFT. While the switching TFT of the switching circuit SWC is turned on, a data signal is applied to the gate electrode of the driving TFT DRTFT and a first capacitor electrode of the storage capacitor of the switching circuit SWC. The driving TFT DRTFT adjusts a driving current flowing through the light emitting diode LED according to a voltage difference between the gate and source electrodes of the driving TFT DRTFT. In addition, the storage capacitor maintains a voltage of the gate electrode of the driving TFT DRTFT for a predetermined time period such as one frame. As a result, the light emitting diode LED of FIG. 4 emits a light according to the driving current through the driving TFT DRTFT.

Figure 5:
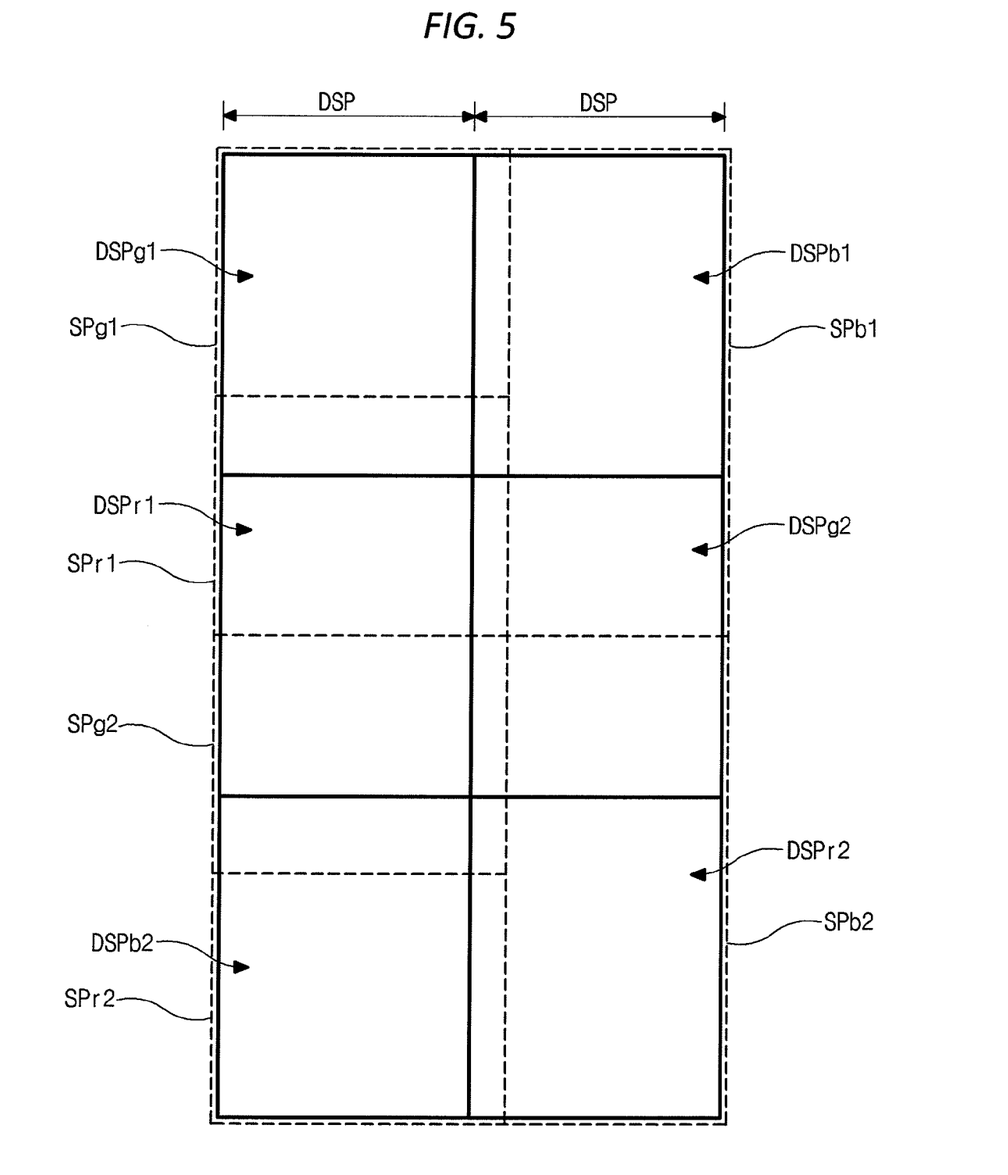
FIG. 5 is a plan view showing a plurality of sub-pixels and a plurality of driving sub-pixels of a top emission type organic light emitting display device according to an embodiment of the present invention.
Figure 6:
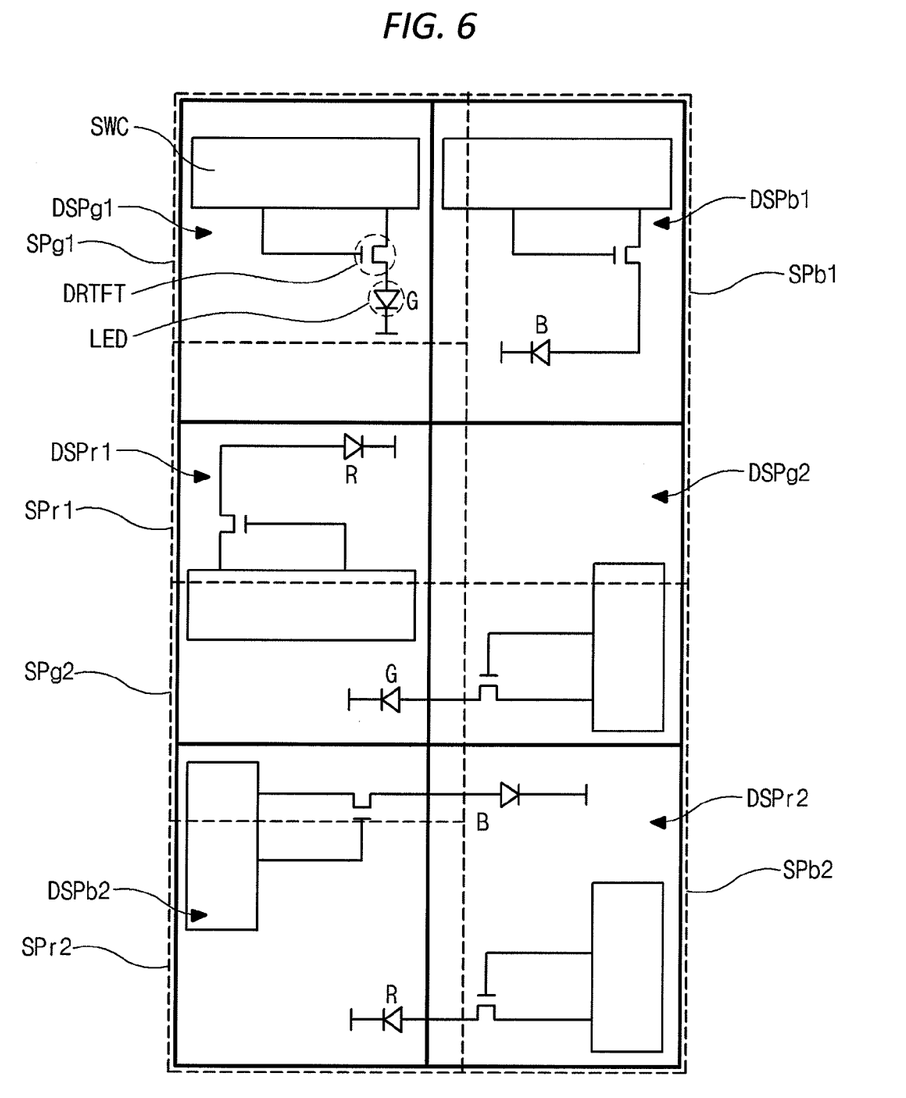
FIG. 6 is a plan view showing a sub-pixel circuit unit in a plurality of sub-pixels and a plurality of driving sub-pixels of a top emission type organic light emitting display device according to an embodiment of the present invention.

According to the present invention, FIGS. 5 and 6 illustrate an example of how sub-pixels and driving sub-pixels may be arranged with respect to each other using to the configuration of FIG. 3. A driving sub-pixel is a defined area in which at least the SWC and the DRTFT of the sub-pixel circuit unit 400 for driving a sub-pixel are located.

FIG. 5 is a plan view showing a plurality of sub-pixels and a plurality of driving sub-pixels of a top emission type organic light emitting display device according to an embodiment of the present invention, and FIG. 6 is a plan view showing sub-pixel circuit units provided in the plurality of sub-pixels and driving sub-pixels of FIG. 5 according to an embodiment of the present invention. A driving sub-pixel may be defined as an area where a switching circuit SWC and a driving TFT (DRTFT) of a sub-pixel circuit unit 400 are formed.

In the OLED device of FIG. 5, the plurality of sub-pixels forming one or more pixels P includes green and red sub-pixels alternately repeated along a vertical direction (or a first direction) and a blue sub-pixel adjacent to the green and red sub-pixels along a horizontal direction (or a second direction perpendicular or substantially perpendicular to the first direction). The boundaries of these sub-pixels are indicated with dotted lines in FIG. 5. For example, a first green sub-pixel SPg1, a first red sub-pixel SPr1, a second green sub-pixel SPg2 and a second red sub-pixel SPr2 may be sequentially disposed along the vertical direction. In addition, a first blue sub-pixel SPb1 may be disposed adjacent to the first green sub-pixel SPg1 and the first red sub-pixel SPr1 along the horizontal direction, and a second blue sub-pixel SPb2 may be disposed adjacent to the second green sub-pixel SPg2 and the second red sub-pixel SPr2 along the horizontal direction. The sub-pixels SPg1, SPr1 and SPb1 are arranged as shown in FIG. 3. Similarly, the sub-pixels SPg2, SPr2 and SPb2 are arranged are arranged as shown in FIG. 3.

The plurality of driving sub-pixels DSP are indicated with dark solid lines in FIG. 5. Each of the plurality of driving sub-pixels DSP may correspond to a region overlapping with at least two of the plurality of sub-pixels. For example, the plurality of driving sub-pixels may include a first green driving sub-pixel DSPg1 overlapping with the first green sub-pixel SPg1 and the first red sub-pixel SPr1; a first red driving sub-pixel DSPr1 overlapping with the first red sub-pixel SPr1 and the second green sub-pixel SPg2; a first blue driving sub-pixel DSPb1 overlapping with the first green sub-pixel SPg1, the first red sub-pixel SPr1 and the first blue sub-pixel SPb1; a second green driving sub-pixel DSPg2 overlapping with the first red sub-pixel SPr1, the first blue sub-pixel SPb1, the second green sub-pixel SPg2 and the second blue sub-pixel SPb2; a second red driving sub-pixel DSPr2 overlapping with the second green sub-pixel SPg2, the second red sub-pixel SPr2 and the second blue sub-pixel SPb2; and a second blue driving sub-pixel DSPb2 overlapping with the second green sub-pixel SPg2 and the second red sub-pixel SPr2.

In addition, the plurality of driving sub-pixels DSP may be disposed in matrix. For example, the first green driving sub-pixel DSPg1, the first blue driving sub-pixel DSPb1, the first red driving sub-pixel DSPr1, the second green driving sub-pixel DSPg2, the second blue driving sub-pixel DSPb2 and the second red driving sub-pixel DSPr2 may be disposed in a 3×2 matrix.

The plurality of driving sub-pixels DSP may have the same size and the same shape as one another. In addition, each of the plurality of driving sub-pixels DSP has first and second sides along horizontal and vertical directions, respectively. For example, each of the plurality of driving sub-pixels DSP may have the first side smaller than the second side. Further, the first side of each of the red and green sub-pixels SPg1, SPr1, SPg2 and SPr2 is greater than the first side of each of the plurality of driving sub-pixels DSP, and the second side of each of the red and green sub-pixels SPg1, SPr1, SPg2 and SPr2 is smaller than the second side of each of the plurality of driving sub-pixels DSP. Moreover, the first side of the blue sub-pixel SPb1 and SPb2 is smaller than the first side of each of the plurality of driving sub-pixels DSP, and the second side of the blue sub-pixel SPb1 and SPb2 is greater than the second side of each of the plurality of driving sub-pixels DSP.

FIG. 6 shows an example of the sub-pixel circuit units disposed in the sub-pixels and driving sub-pixels of FIG. 5. In FIG. 6, a switching circuit SWC and a driving thin film transistor (TFT) DRTFT of a sub-pixel circuit unit 400 (of FIG. 4) are formed in each of the plurality of driving sub-pixels DSP. On the other hand, a light emitting diode LED of the sub-pixel circuit unit 400 is formed in each of the plurality of sub-pixels. As a result, one or more light emitting diodes LEDs are formed in some of the plurality of driving sub-pixels DSP indicated by the dark solid lines. Further, each light emitting diode LED is formed either in the driving sub-pixel where the corresponding sub-pixel circuit unit 400 is formed or in a neighboring driving sub-pixel DSP adjacent to the driving sub pixel DSP where the corresponding sub-pixel circuit unit 400 is formed.

For example, the first green driving sub-pixel DSPg1, the first red driving sub-pixel DSPr1 and the second blue driving sub-pixel DSPb2 may be sequentially disposed along a vertical direction in a first column. In addition, the first blue driving sub-pixel DSPb1, the second green driving sub-pixel DSPg2 and the second red driving sub-pixel DSPr2 are sequentially disposed along the vertical direction in a second column.

As a result, the first green driving sub-pixel DSPg1 for driving the light emitting diode LED emitting a green-colored light is disposed in the first column to correspond to the first green sub-pixel SPg1 and the first red sub-pixel SPr1. The first red driving sub-pixel DSPr1 for driving the light emitting diode LED emitting a red-colored light is disposed in the first column to correspond to the first red sub-pixel SPr1 and the second green sub-pixel SPg2. The second blue driving sub-pixel DSPb2 for driving the light emitting diode LED emitting a blue-colored light is disposed in the first column to correspond to the second green sub-pixel SPg2 and the second red sub-pixel SPr2. In addition, the first blue driving sub-pixel DSPb1 for driving the light emitting diode LED emitting a blue-colored light is disposed in the second column to correspond to the first green sub-pixel SPg1, the first red sub-pixel SPr1 and the first blue sub-pixel SPb1. The second green driving sub-pixel DSPg2 for driving the light emitting diode LED emitting a green-colored light is disposed in the second column to correspond to the first red sub-pixel SPr1, the first blue sub-pixel SPb1, the second green sub-pixel SPg2 and the second blue sub-pixel SPb2. The second red driving sub-pixel DSPr2 for driving the light emitting diode LED emitting a red-colored light is disposed in the second column to correspond to the second green sub-pixel SPg2, the second red sub-pixel SPr2 and the second blue sub-pixel SPb2.

Since each of the plurality of driving sub-pixels DSP is defined to correspond to a region overlapping at least two of the plurality of sub-pixels as discussed above, an area for forming the driving elements such as the sub-pixel circuit unit is enlarged according to the present invention. In addition, since the plurality of driving sub-pixels DSP has the same size and the same shape as one another, degree of freedom in design and integration of the driving elements is improved.

Figure 7:
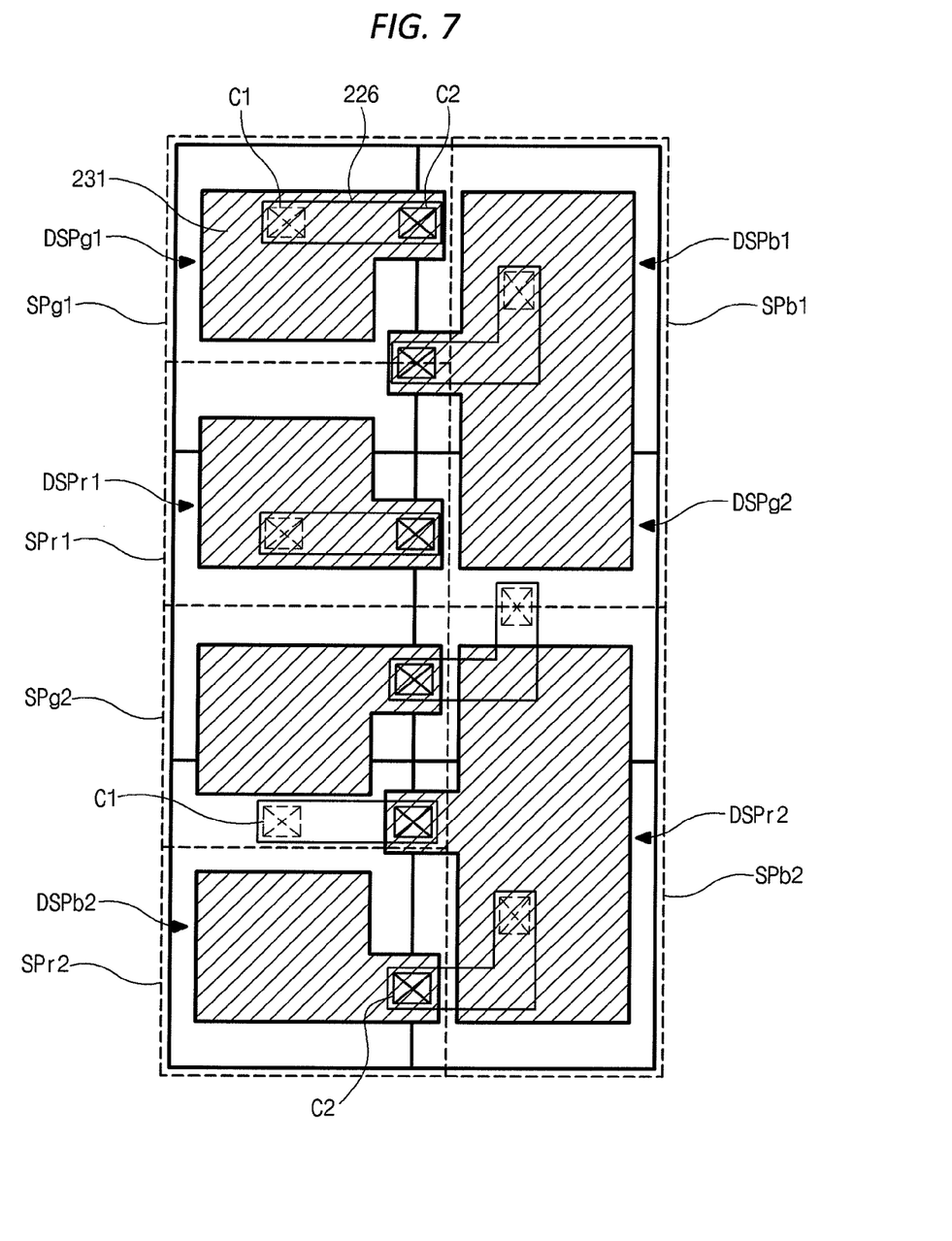
FIG. 7 is a plan view showing a first electrode and a connection line of a top emission type organic light emitting display device according to an embodiment of the present invention.

FIG. 7 is a plan view showing a first electrode and a connection line of a top emission type organic light emitting display device according to an embodiment of the present invention. More specifically, FIG. 7 illustrates locations of first electrodes and connection lines in the sub-pixels and driving sub-pixels of FIGS. 5 and 6.

In FIG. 7, a first electrode of a sub-pixel is formed in each of the plurality of sub-pixels of FIGS. 5 and 6. For example, the first electrode 231 (FIG. 2) may be formed in each of the first green sub-pixel SPg1, the first red sub-pixel SPr1, the first blue sub-pixel SPb1, the second green sub-pixel SPg2, the second red sub-pixel SPr2 and the second blue sub-pixel SPb2. In each driving sub-pixel DSP, the drain electrode 223b (of FIG. 2) of the corresponding driving thin film transistor (TFT) DRTFT (of FIG. 2) is connected to a connection line 226 through as first connection contact hole C1. In each sub-pixel SP, the first electrode 231 is connected to the connection line 226 through a second connection contact hole C2. As a result, the first electrode 231 is electrically connected to the drain electrode 223b of the driving TFT DRTFT through the connection line 226.

The first connection contact hole C1 is disposed in each of the plurality of driving sub-pixels DSP. For each of the plurality of sub-pixels, the second connection contact hole C2 is located to provide an electrical contact with a corresponding one of the sub-pixels SP. For instance, one second connection contact hole C2 can be provided in each of the sub-pixels SP. However, the invention is not limited thereto and covers other variations. For instance, the location of each second connection contact hole C2 does not necessarily need to be in the corresponding sub-pixel. Instead, for instance, the second connection contact hole C2 for connecting with the blue sub-pixel SPb1 can be positioned in sub-pixel(s) such as SPg1 and SPr1 as shown in FIG. 7. As a result, the second connection contact hole C2 may be disposed regardless of the plurality of driving sub-pixels DSP and the sub-pixels SP. The second connection contact hole C2 may be disposed at one end portion of the first electrode 231. In addition, the second connection contact holes C2 of the first electrodes 231 of the adjacent sub-pixels may be disposed along a straight line. For instance, all the second contact holes C2 can be disposed to be aligned with each other and form a straight line as shown in FIG. 7.

In the top emission type organic light emitting display device according to the present invention, the number and the disposition of the driving elements such as the SWC and driving TFT for driving the light emitting diode may vary as desired.

In addition, a design area for driving elements in a pixel is enlarged by changing disposition of the driving elements with respect to sub-pixels. Further, an organic light emitting display device having a high color reproducibility and a high resolution is obtained, and the degree of freedom in design and integration of the driving elements for driving a light emitting diode in a sub-pixel is improved.

It will be apparent to those skilled in the art that various modifications and variations can be made in an organic light emitting display device of the present disclosure without departing from the sprit or scope of the invention. Thus, it is intended that the present invention covers the modifications and variations of this invention provided they come within the scope of the appended claims and their equivalents.

What is claimed is:

1. An organic light emitting display device, comprising:
a plurality of color sub-pixels on a substrate and including first, second and third color sub-pixels,
each of the color sub-pixels including a light emitting diode configured to generate light,
the first and second color sub-pixels disposed along a first direction, and the third color sub-pixel disposed adjacent to the first and second color sub-pixels along a second direction different from the first direction; and
a plurality of driving sub-pixels on the substrate and configured to drive the light emitting diodes of the color sub-pixels,
each of the driving sub-pixels including at least a driving transistor and a switching unit,
each and every one of the driving sub-pixels overlapping with at least two color sub-pixels among the plurality of color sub-pixels,
wherein the first, second and third color sub-pixels correspond to a portion of four of the driving sub-pixels, and
wherein one of the driving sub-pixels overlaps with three or four corresponding color sub-pixels among the plurality of color sub-pixels,
wherein the plurality of driving sub-pixels include first to sixth driving sub-pixels disposed in three rows and two columns,
wherein the first color sub-pixel overlaps the first and third driving sub-pixels, the second color sub-pixel overlaps the first to fourth driving sub-pixels, and the third color sub-pixel overlaps third and fourth driving sub-pixels,
wherein the plurality of color sub-pixels further includes fourth, fifth and sixth color sub-pixels, the fourth color subs-pixel disposed adjacent to the second color sub-pixel along the first direction, the sixth color sub-pixel disposed adjacent to the third color sub-pixel along the first direction, the fourth and fifth color sub-pixels disposed along the first direction, and the sixth color sub-pixel disposed adjacent to the fourth and fifth color sub-pixels along the second direction, and
wherein the first to third color sub-pixels correspond to the first to fourth driving sub-pixels, and the fourth to sixth color sub-pixels correspond to the third to sixth driving sub-pixels.

2. The device according to claim 1, wherein the plurality of driving sub-pixels include a first driving sub-pixel covering a predetermined display area,
portions of the first and second color sub-pixels covering the same predetermined display area, and
the driving transistor in the first driving sub-pixel is electrically connected to and drives a light emitting diode in at least one selected from the second and third color sub-pixels.

3. The device according to claim 1, wherein the light emitting diode in each of the color sub-pixels includes:
a first electrode on the substrate over a driving thin film transistor of the corresponding driving
an organic emitting layer on the first electrode; and
a second electrode on the organic emitting layer.

4. The device according to claim 1, further comprising:
a plurality of connection lines, each of the connection lines electrically connecting a drain electrode of one driving transistor to one first electrode of the light emitting diode of one color sub-pixel.

5. The device according to claim 4, wherein the one driving transistor is electrically connected to the connection line through a first connection contact hole, and the one first electrode is electrically connected to the same connection line through a second connection contact hole.

6. The device according to claim 1, wherein the driving transistor in each of the plurality of driving sub-pixels is electrically connected to the light emitting diode provided in one of the plurality of color sub-pixels through a contact hole, and
all the contact holes associated with the driving transistors form a line.

7. The device according to claim 1, wherein the first, second and third color sub-pixels are either green, red and blue sub-pixels, respectively, or red, green and blue sub-pixels, respectively.

8. The device according to claim 1, wherein a first side of each of the first and second color sub-pixels that is extending in the first direction is longer than a first side of each of the driving sub-pixels that is extending in the first direction, or
a second side of each of the first and second color sub-pixels that is extending in the second direction is shorter than a second side of each of the driving sub-pixels that is extending in the second direction.

9. The device according to claim 1, wherein a first side of the third color sub-pixel that is extending in the first direction is shorter than a first side of each of the driving sub-pixels that is extending in the first direction, and
a second side of the third color sub-pixel that is extending in the second direction is longer than a second side of each of the driving sub-pixels extending in the second direction.

10. The device according to claim 1, wherein the driving sub-pixels provided in a predetermined display area have a same size and a same shape with each other, and
at least one of the color sub-pixels provided in the same predetermined display area has a size and shape that are different from another one of the color sub-pixels provided in the same predetermined display area.

11. The device according to claim 1, wherein the first and second directions are perpendicular to each other.

12. The device according to claim 1, wherein the fourth color sub-pixel overlaps the second, fourth, fifth and sixth driving sub-pixels, the fifth color sub-pixel overlaps the fifth and sixth driving sub-pixels, and the sixth color sub-pixel overlaps fourth and sixth driving sub-pixels.

13. The device according to claim 1, wherein the first to sixth color sub-pixels and the first to sixth driving sub-pixels constitute first and second pixels, and the first and second pixels are repeated along the first and second directions as a minimum unit.

* * * * *